US007138708B2

United States Patent
Topp et al.

(10) Patent No.: US 7,138,708 B2
(45) Date of Patent: Nov. 21, 2006

(54) ELECTRONIC SYSTEM FOR FIXING POWER AND SIGNAL SEMICONDUCTOR CHIPS

(75) Inventors: Rainer Topp, Reutlingen (DE); Dirk Balszunat, Stuttgart (DE); Christoph Ruf, Eningen (DE); Andreas Fischer, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/495,233

(22) PCT Filed: Oct. 15, 2002

(86) PCT No.: PCT/DE02/03883

§ 371 (c)(1),
(2), (4) Date: Mar. 8, 2005

(87) PCT Pub. No.: WO03/046988

PCT Pub. Date: Jun. 5, 2003

(65) Prior Publication Data

US 2005/0151161 A1    Jul. 14, 2005

(30) Foreign Application Priority Data

Nov. 17, 2001   (DE) ................ 101 56 626

(51) Int. Cl.
*H01L 25/07*   (2006.01)
*H01L 23/48*   (2006.01)

(52) U.S. Cl. .............. 257/685; 257/E23.004; 257/E23.172; 257/E25.03; 257/686; 257/777; 257/723; 257/774; 257/773; 257/680; 257/731; 257/726; 257/673

(58) Field of Classification Search ........ 257/723, 257/686, 685, 777, 774, 773, 726, 680, 778, 257/673, 676, 675, 712, 713, 717, 720, 925, 257/729, 731, 701–703, 177, 180, E25.03, 257/E23.004

See application file for complete search history.

(56) References Cited

U.S. PATENT DOCUMENTS

| 4,047,197 | A |   | 9/1977  | Schierz |
| 4,561,006 | A | * | 12/1985 | Currie ................ 257/697 |
| 4,742,385 | A | * | 5/1988  | Kohmoto ............. 257/697 |
| 5,006,921 | A |   | 4/1991  | Ishizuka et al. |
| 5,095,359 | A | * | 3/1992  | Tanaka et al. ........ 257/703 |
| 5,150,231 | A | * | 9/1992  | Iwamoto et al. ........ 349/60 |
| 5,237,204 | A | * | 8/1993  | Val .................. 257/698 |
| 5,444,297 | A | * | 8/1995  | Oshima et al. ....... 257/691 |
| 5,909,058 | A | * | 6/1999  | Yano et al. .......... 257/712 |
| 5,942,797 | A | * | 8/1999  | Terasawa ............ 257/723 |
| 5,966,291 | A | * | 10/1999 | Baumel et al. ....... 361/707 |
| 6,125,039 | A |   | 9/2000  | Suzuki |

FOREIGN PATENT DOCUMENTS

| DE | 2444418     | 4/1976 |
| DE | 32 01 296   | 7/1983 |
| GB | 2 146 174   | 4/1985 |
| WO | WO 98/15005 | 4/1998 |
| WO | WO 01/24260 | 4/2001 |

* cited by examiner

*Primary Examiner*—Alexander Oscar Williams
(74) *Attorney, Agent, or Firm*—Kenyon & Kenyon LLP

(57) ABSTRACT

An electronic system having a sandwich design and including two carriers, each carrier having a printed circuit layer, the upper printed circuit layer being positioned on different planes.

4 Claims, 1 Drawing Sheet

ELECTRONIC SYSTEM FOR FIXING POWER AND SIGNAL SEMICONDUCTOR CHIPS

BACKGROUND INFORMATION

A power module is known from PCT International Patent Publication No. WO 98/15005, in which power transistors are mounted between two DBC (direct bonded copper) substrates having structured CU layers as the wiring level, the fronts and backs of the chips being bonded to the CU layers via a solder layer. If necessary, optional spacer balls may be used to ensure that the solder layer on the structured metal layers on the front of the chips retains an adequate thickness during and after the reflow soldering process. One feature of the DBC substrate is that the CU layers cannot be structured to just any fineness, due to their thickness—typically approximately 300 µm. The CU layer's thickness is necessary to adequately dissipate heat loss from the power chips and to conduct the high currents in the module with as little resistance as possible. As a result, the minimum distance between two CU areas cannot be much smaller than the thickness of the CU layer.

SUMMARY OF THE INVENTION

A major disadvantage of the design known from the related art is that it is suitable only for mounting preferably roughly structured front leads of power chips and uniform chip thicknesses. As a result, it is not possible to combine power components (power chips) and signal components (signal ICs) if the signal ICs have a large number of finely structured front leads, and if the signal ICs have chip thicknesses that deviate substantially from the power chip thicknesses. The electronic system according to the present invention has the advantage over the related art that it enhances the module design very easily and economically by combining power chips and signal ICs.

DETAILED DESCRIPTION

Figure 1:
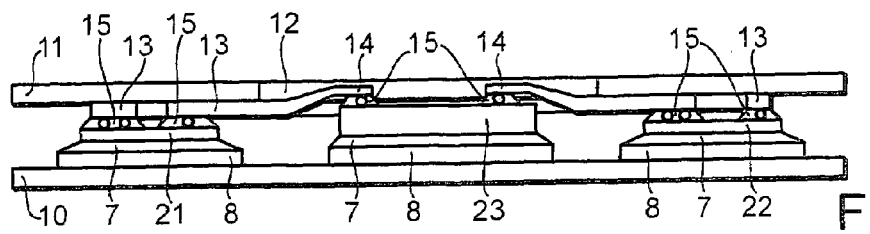
FIG. 1 shows a first exemplary embodiment of the electronic system.

FIG. 1 shows a module design of an electronic system according to the present invention for a first embodiment of the present invention. The electronic system includes a first carrier 10 and a second carrier 11. A plurality of electronic circuits in the form of semiconductor chips, which are identified in FIG. 1 by reference numbers 21, 22 and 23, are ordinarily positioned between carriers 10, 11. According to the present invention, it is possible to provide fewer than three semiconductor chips 21, 22, 23 between carriers 10, 11 as well as a larger number of such semiconductor chips 21, 22, 23. In FIG. 1, a first and a second power semiconductor chip are identified by reference numbers 21 and 22. Power semiconductor chips 21, 22 are characterized by the fact that, in particular, a great amount of heat, which is dissipated, if necessary, within power semiconductor chips 21, 22, must be discharged via thermal couplings. Therefore, reference number 23 in FIG. 1 identifies a signal IC that is provided for signal processing. Signal IC 23 ordinarily has much lower heat dissipation requirements than power semiconductor chips 21, 22. In the case of signal IC 23 according to FIG. 1, the semiconductor substrate of signal IC 23 is thicker than the semiconductor substrate of the two power semiconductor chips 21, 22.

Figure 2:
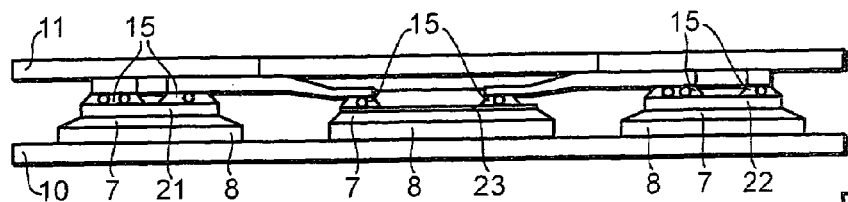
FIG. 2 shows a second exemplary embodiment of the electronic system.

FIG. 2 also shows the electronic system according to the present invention, first carrier 10, second carrier 11 and semiconductor chips 21, 22, 23 again being provided. In contrast to FIG. 1, however, the thickness of signal IC 23 in FIG. 2 is smaller than the thickness of power semiconductor chips 21, 22.

Both FIG. 1 and FIG. 2 are described together below, however including a discussion of the differences. An essence of the present invention is the use of a special second carrier 11 in such a way that sub-areas of second carrier 11 have a finely structured contact layer that is adjustable in distance relative to lower first carrier 10, allowing signal IC chips to be cost-effectively integrated into the overall module or into the complete electronic system without changing the module assembly procedure over that of the related art.

First carrier 10, which is also referred to below as lower carrier 10, includes, in particular, a ceramic material as the carrier substance to which a lower contact layer 8 is applied in sub-areas—i.e., lower contact layer 8 is structured. Lower contact layer 8 is provided according to the present invention, in particular, as a copper layer, which is also referred to below as lower CU layer 8. Lower carrier 10, along with lower contact layer 8 located thereon, is provided according to the present invention, in particular, as a DBC substrate and is therefore also referred to below as lower DBC substrate 10. In both FIG. 1 and FIG. 2, an electrically and thermally conductive connection on lower CU layer 8 of lower carrier 8 is provided individually to each of semiconductor chips 21, 22, 23 in the form of lower solder layers 7.

Semiconductor chips 21, 22, 23 also have leads on their fronts and backs which are supplied by the second carrier, i.e., upper carrier 11. Upper carrier 11 is provided according to the present invention, in particular, also as a DBC substrate and is therefore also referred to as upper DBC substrate 11. Upper carrier 11 has recesses 12 in sub-areas. A contact layer that is identified by reference number 13 in the areas where the upper carrier does not have a recess 12 and is identified by reference number 14 in the areas where upper carrier 11 does have recess 12, is also provided on upper carrier 11. Upper contact layer 13, 14, which is provided according to the present invention, in particular, also as CU layer 13, 14, is used to contact the top of semiconductor chips 21, 22, 23. Because the contact layer does not come into contact with upper carrier 11 in its areas 14, it is possible for "free contact layer" 14 to have a limited flexibility in a direction positioned at right angles to the plane of upper carrier 11. As a result, free contact layer 14 is bendable, i.e., plastically deformable, in the upward direction, i.e., in the direction of second carrier 11, so that upper contact layer 13, 14 as a whole is able to contact a thinner power semiconductor chip 21, 22 and also electrically contact a thicker signal IC 23, even though the power semiconductor chip and the signal IC chip are positioned at the same level from the perspective of their lower sides, i.e., from first carrier 10, contact layer 8 and solder layer 7. FIG. 2 shows the opposite case, namely one in which signal IC chip 23 is thinner than power semiconductor chips 21, 22. In this second embodiment of the electronic system according to the present invention, free area 14 of upper contact layer 13, 14 is therefore plastically deformed in a downward direction, so that, once again, it is ensured that upper contact layer 13, 14 as a whole contacts power semiconductor chips 21, 22 and signal IC chip 23. According to the present invention, therefore, upper contact layer 13, 14 is located on a first plane in its area 13 that does not have a recess 12, while it is at least partially positioned on a second plane that differs from the first plane in its "free" area 14.

According to the present invention, both embodiments are designed so that a solder layer 15, which has spacer balls which are not identified in greater detail by a reference number, is provided between upper contact layer 13, 14 and the semiconductor chips.

Figure 3:
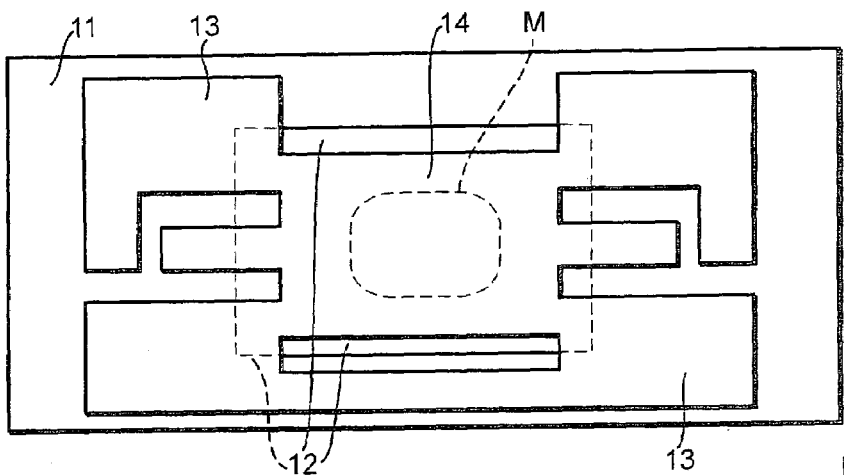
FIG. 3 shows an upper DBC substrate prior to punching and embossing.

FIG. 3 shows upper carrier 11 and upper contact layer 13. In the central area of upper carrier 11, recess 12 is represented by a dotted rectangle. FIG. 3 also shows areas 13 of upper contact layer 13, 14, which are provided in areas of upper carrier 11 where recess 12 is not provided. Areas 14 of upper contact layer 13, 14 which are provided in the area of recess 12 are also shown. According to the present invention, free areas 14 of upper contact layer 13, 14 are provided with additional structuring in the area of recess 12 (for example, using a stamping die) that is finer than the structuring of upper contact layers 13, 14 provided in the area of upper carrier 11 at locations where recess 12 is not present.

Figure 4:
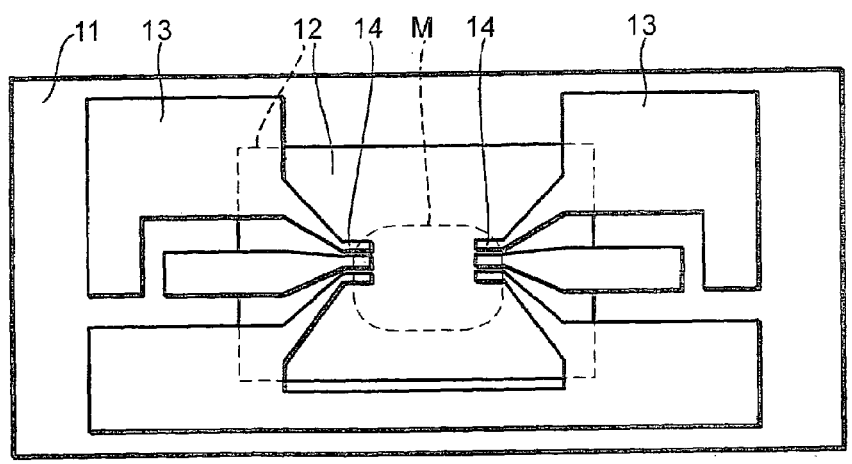
FIG. 4 shows an upper DBC substrate after punching and embossing.

FIG. 4 shows an additional and finer structuring of this type, where upper carrier 11 is illustrated with structuring layer 13, 14 and recess 12, the difference between FIG. 4 and FIG. 3 being that free areas 14 of upper contact layer 13, 14 are more finely structured. Based on the unstructured central area of free upper contact layer 14 identified by reference letter M and shown in FIG. 3, free area 14 of upper contact layer 13, 14 is finely structured, in particular in the form of finely structured leads which are designed, in particular, for signal IC chips 23.

The structuring step marking the transition from FIG. 3 to FIG. 4 is provided according to the present invention, in particular, as a punching and embossing process. However, other mechanical and/or other structuring methods are also provided according to the present invention. In the case of the punching and embossing process according to the present invention, free areas 14 of the upper contact layer are geometrically structured, i.e., structuring along the plane of upper carrier 11, as well as structuring in the orthogonal direction thereto, i.e., excursions of free areas 14 of upper contact layer 13, 14 are provided to compensate for different thicknesses of the semiconductor chips provided in the region of free areas 14 of the upper contact layer.

According to the present invention, this makes it advantageously possible to provide chips 21, 22, 23 of different thicknesses in a single, sandwich-type electronic system according to the present invention. It is therefore also advantageously possible, according to the present invention, to integrate signal ICs having finely structured leads and having a large number of leads into the electronic system according to the present invention that is designed, in particular, as a power module. Advantageously, according to the present invention, no additional parts are needed. Another advantage of this, according to the present invention, is that an unmodified module assembly procedure may be used, i.e., it is possible to assemble all chips in a reflow soldering process. The electronic system according to the present invention is also economical because the minimal additional cost for punching and embossing the as yet componentless DBC substrate in a die is made possible by multiple substrate utilization. The term multiple substrate utilization means combining multiple individual substrates for simultaneous processing. According to the present invention, it is further possible to use the fine structuring of free areas 14 of upper contact layer 13, 14 in the area of the external leads of the electronic system according to the present invention to substantially increase the number of external leads of the module. Another advantage is that, according to the present invention, both signal ICs 23 and power chips 21, 22 are mountable on the same plane on lower carrier 10, or on its contact layer 8. This makes it possible to continue mounting the complete power module or the complete electronic system over the entire front and back, i.e., in a thermally optimum manner.

According to the related art, the signal ICs are mounted on the external surface of the module, thereby preventing extensive cooling on both sides of the module.

According to the present invention, upper carrier 11 of the electronic system according to the present invention and its contact layer 13, 14 have the following properties:

In the area of power chips 21, 22, the design of DBC layer 11 remains the same vis-à-vis an upper carrier 11 without recess 12.

In the areas in which signal ICs 23 are to be connected with the help of free areas 14 of upper contact layer 13, 14, the ceramic area of the substrate, i.e., upper carrier 11, has a recess—i.e., recess 12 or recesses 12 are provided—and contact layer 13, 14, which was originally typically 300 μm thick, is modified by a punching and embossing operation so that a finely structured contacting of signal IC 23, which is adjusted in height, i.e., in the orthogonal direction relative to the plane of upper carrier 11, to the thickness of signal IC 23 may be provided without having to modify the assembly procedure for the entire module or the entire electronic system. Contact layer 13, 14 may be adjusted to both thicker and thinner IC chips 23 in its free area 14, compared to power chips 21, 22. To punch and emboss the upper contact layer as easily as possible in the IC contact area of recess 12, it may be optionally helpful, according to the present invention, to provide upper contact layer 13, 14 with a thinner design in the embossing area, i.e., in free area 14, prior to sintering it onto upper carrier 11, i.e., for example using a thickness of approximately 50 μm to 250 μm.

What is claimed is:

1. A sandwich-type electronic system for fixing semiconductor chips comprising:
   a first carrier;
   a second carrier situated substantially parallel to the first carrier;
   at least one signal IC semiconductor chip disposed between the first and second carriers; and
   at least one power semiconductor chip disposed between the first and second carriers;
   wherein the first carrier has a first printed circuit layer on a side facing the second carrier;
   wherein the second carrier has a second printed circuit layer on a side facing the first carrier;
   wherein the second printed circuit layer is situated partially on a first plane, and the second printed circuit layer, in a sub-area, is situated at least partially on a second plane; and
   wherein the signal IC and the power semiconductor chips have different thicknesses.

2. The electronic system according to claim 1, wherein the second carrier has a recess in the sub-area.

3. The electronic system according to claim 1, wherein the at least one signal IC is situated in the sub-area between the first and second carriers.

4. The electronic system according to claim 3, wherein the at least one power semiconductor chip is situated between the first and second carriers outside the sub-area.

* * * * *